United States Patent
Yeh

(10) Patent No.: US 8,559,252 B2
(45) Date of Patent: Oct. 15, 2013

(54) MEMORY TESTING DEVICE HAVING CROSS INTERCONNECTIONS OF MULTIPLE DRIVERS AND ITS IMPLEMENTING METHOD

(75) Inventor: Chih-Hui Yeh, Hsinchu (TW)

(73) Assignee: Powertech Technology Inc., Hsinchu (TW)

( * ) Notice: Subject to any disclaimer, the term of this patent is extended or adjusted under 35 U.S.C. 154(b) by 0 days.

(21) Appl. No.: 13/421,100

(22) Filed: Mar. 15, 2012

(65) Prior Publication Data

US 2012/0327729 A1    Dec. 27, 2012

(30) Foreign Application Priority Data

Jun. 27, 2011  (TW) .............................. 100122498 A

(51) Int. Cl.
*G11C 7/00*    (2006.01)
(52) U.S. Cl.
USPC ........................................................ 365/201
(58) Field of Classification Search
USPC ........................................................ 365/201
See application file for complete search history.

(56) References Cited

U.S. PATENT DOCUMENTS

| | | | |
|---|---|---|---|
| 6,700,823 B1 * | 3/2004 | Rahman et al. | 365/189.05 |
| 6,952,111 B1 | 10/2005 | Chih-Hui | |
| 2002/0141274 A1 * | 10/2002 | Gall et al. | 365/226 |
| 2003/0210069 A1 * | 11/2003 | Kikuchi et al. | 324/765 |
| 2003/0235107 A1 * | 12/2003 | Jang | 365/233 |
| 2005/0102589 A1 * | 5/2005 | Park et al. | 714/718 |
| 2006/0195747 A1 * | 8/2006 | Pramanick et al. | 714/742 |

* cited by examiner

*Primary Examiner* — Hoai V Ho
*Assistant Examiner* — Jay Radke
(74) *Attorney, Agent, or Firm* — Muncy, Geissler, Olds & Lowe, PLLC

(57) ABSTRACT

Disclosed is a memory testing device having cross interconnections of multiple drivers, comprising a first wiring bus and a second wiring bus connected to a first device area and a third wiring bus and a fourth wiring bus connected to a second device area. A first I/O driver module is connected to the first wiring bus through a first driving bus. A second I/O driver module is connected to the third wiring bus through the second driving bus. The fourth wiring bus is Y-shaped connected to the node between the first wiring bus and first driving bus. And, the second wiring bus is Y-shaped connected to the node between the third wiring bus and the second driving bus.

8 Claims, 2 Drawing Sheets

MEMORY TESTING DEVICE HAVING CROSS INTERCONNECTIONS OF MULTIPLE DRIVERS AND ITS IMPLEMENTING METHOD

FIELD OF THE INVENTION

The present invention relates to a testing methodology of semiconductor devices, and more specifically to a memory testing device with cross interconnection of multiple drivers.

BACKGROUND OF THE INVENTION

Memory is designed and equipped in various electronic devices where DDR SDRAM is a kind of DRAM that can support double data rate i.e., transferring data on both the rising and falling edges of the DQ data strobe (DQS) signal to increase data rates. As the advance of technology, DDR SDRAM has been developed into DDR2 and DDR3 and even DDR4 where the data rates have been increased from 333/400 MHz of DDR to 800 MHz of DDR2, more than 1333 MHz of DDR3, or even higher data rates in the near future. As the increase of frequency, testers having high testing speed should be prepared to test the corresponding memory accordingly.

Testers such as T5503 provided by Advantest offer multiple DUTs (Device Under Test) parallel testing generate required testing patterns where testing fixtures have to be specially designed and implemented to access to DUTs through write and read operation. Normally, testing fixtures include test head, Hi-fix board for memory testing (load board/fixture board/DUT board/adopt board for logic device testing), and socket modules. Test head has different components such as drivers and comparators for signal driving and comparison. The Hi-Fix board has circuitry such as coaxial cables or circuitry of printed circuit boards for electrical connection between circuit modules and socket modules. The socket modules include a printed circuit board with a plurality of sockets to physically carry and electrically connect and test DUTs. Usually, Hi-Fix board and socket modules can be integrated as one single component.

The conventional DRAM memory has input pins and input/output (IO) pins where even with the similar input pin assignment, there are different IO pin configuration designs between x4 and x8 configuration.

Chih-Hui had disclosed an apparatus for universally testing semiconductor devices in U.S. Pat. No. 6,952,111 B1. According to the prior art patent, input pins do not need to consider signal output, therefore, the circuitry of testing fixtures can be simplified and designed as universal testing fixtures, i.e., a driver is implemented to control signal input of two DUTs as prior patent FIG. 3 (prior art) structure.

However, for input/output pins of memory with different I/O configurations, the existing solution is to prepare two sets of testing fixtures where each driver is electrically connected to input/output pins with the specific I/O configuration of a corresponding DUT with an exclusive circuitry as prior patent FIG. 5 (prior art) structure so that testing fixtures are interchanged according to different I/O configuration with different specifications which would greatly increase the capital investment of testers and reduce testing efficiency caused by interchanging of testing fixtures due to testing different I/O configuration. Furthermore, as prior patent FIGS. 6, 7 and 8 (prior art) structure, the revealed conventional testing device is electrically connected to input pins and I/O pins of Hi-Fix where the I/O pins of Hi-Fix are electrically interconnected to I/O pins of different device areas through a wiring bus then connected to drivers and comparators. Moreover, the I/O pins of DUTs in the untested device area are not connected.

SUMMARY OF THE INVENTION

The main purpose of the present invention is to provide a memory testing device with cross interconnection of multiple drivers which is universally used for different I/O configuration such as x4 and x8 without changing testing fixtures.

The second purpose of the present invention is to provide a memory testing device with cross interconnection of multiple drivers where testing patterns are synchronized and written into a plurality of DUTs then read with different sections so that the DUTs do not need to be unloaded and numbers of parallel DUTs do not need to be reduced during testing processes.

According to the present invention, a memory testing device with cross interconnection of multiple drivers is revealed in the present invention, comprising a first wiring bus, a second wiring bus, a third wiring bus, a fourth wiring bus, a first I/O driver module bus, a second I/O driver module bus, a first terminator bus, and a second terminator bus. The first wiring bus and the second wiring bus are connected to the first device area. The third wiring bus and the fourth wiring bus are connected to the second device area. The first I/O driver module bus is connected to the first wiring bus through a first driving bus, and the fourth wiring bus is Y-shaped connected to the node between the first driving bus and the first wiring bus. The second I/O driver module bus is connected to the third wiring bus through a second driving bus, and the second wiring bus is Y-shaped connected to the node between the second driving bus and the third wiring bus. The first terminator bus is connected to the first driving bus through a first grounding bus. The second terminator bus is connected to the second driving bus through a second grounding bus.

The memory testing device with cross interconnection of multiple drivers according to the present invention has the following advantages and effects:

1. Through two additionally wiring buses cross interconnecting to two drivers as a technical mean, DUTs with different I/O configuration can be tested without changing the testing fixtures.
2. Through two additionally wiring buses cross interconnecting to two drivers as a technical mean, testing patterns are synchronized and written into a plurality of DUTs then read with different sections so that the DUTs do not need to be unloaded and numbers of parallel DUTs do not need to be reduced during testing processes.

DESCRIPTION OF REFERENCE NUMBERS

Figure 1:
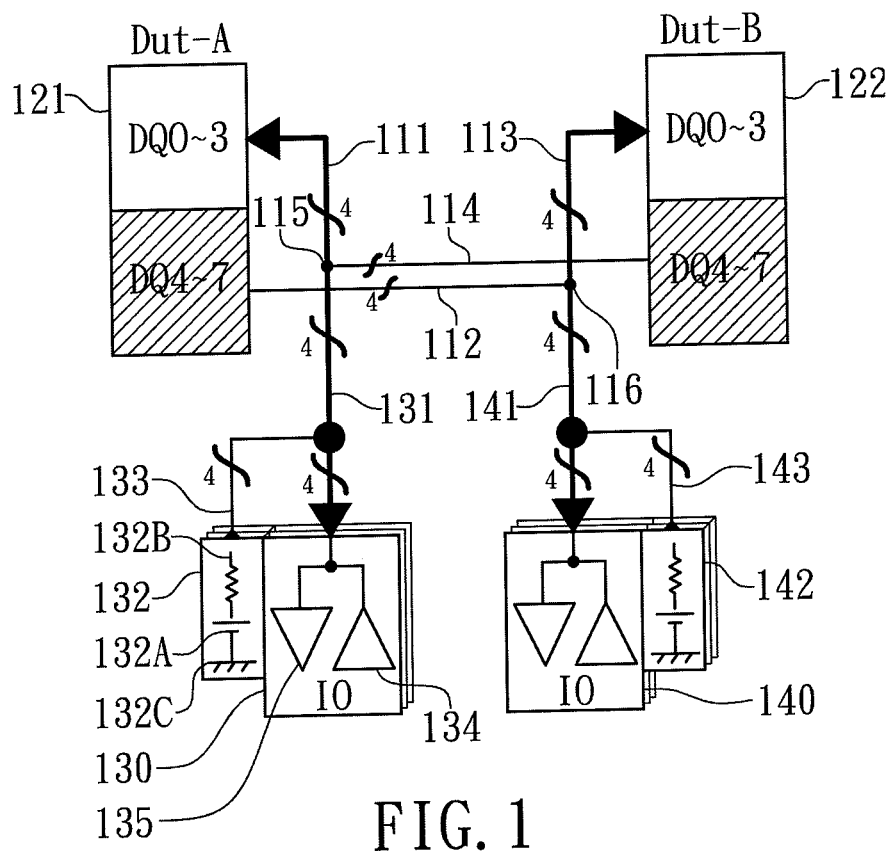
FIG. 1 is a circuitry illustration of a memory testing device with cross interconnection of multiple drivers showing cross interconnections of multiple drivers when reading/writing of I/O pins with x4 test mode according to the preferred embodiment of the present invention.

| | |
|---|---|
| 111: first wiring bus | 112: second terminator bus |
| 113: third wiring bus | 114: fourth wiring bus |
| 115, 116: node | |
| 121: first device area | 122: second device area |
| 130: first I/O driver module bus | |
| 131: first driving bus | 132: first terminator bus |
| 132A: voltage termination bus | 132B: resistor network |
| 132C: ground | |
| 133: first grounding bus | |
| 134: input driver | 135: output receiver |
| 140: second I/O driver module bus | |
| 141: second driving bus | |
| 142: second terminator bus | 143: second grounding bus |
| DQ 0-3, DQ 4-7: I/O pins | |

DETAILED DESCRIPTION OF THE INVENTION

With reference to the attached drawings, the present invention is described by means of the embodiment(s) below where the attached drawings are simplified for illustration purposes only to illustrate the structures or methods of the present invention by describing the relationships between the components and assembly in the present invention. Therefore, the components shown in the figures are not expressed with the actual numbers, actual shapes, actual dimensions, nor with the actual ratio. Some of the dimensions or dimension ratios have been enlarged or simplified to provide a better illustration. The actual numbers, actual shapes, or actual dimension ratios can be selectively designed and disposed and the detail component layouts may be more complicated.

According to the preferred embodiment of the present invention, a memory testing device with cross interconnection of multiple drivers is revealed where different testing modes are illustrated from FIG. 1 to FIG. 4. The memory testing device is implemented in memory testing of I/O pins of DUTs and installed in testing fixtures where the memory testing device comprises a first wiring bus 111, a second wiring bus 112, a third wiring bus 113 a fourth wiring bus 114, a first I/O driver module bus 130, a first terminator bus 132, a second I/O driver module bus 140, and a second terminator bus 142. The first wiring bus 111 and the second wiring bus 112 are connected to a first device area 121. The location of the first device area 121 is corresponding to a socket to physically carry and electrically connect a first DUT where the first DUT has I/O pins of DQ 0~3 and DQ 4~7. When x4 figuration is implemented, there are four I/O pins from DQ 0~3 for 4-bit signal transmission and when x8 figuration is implemented, there are eight I/O pins of DQ 0~3 and DQ 4~7 for 8-bit signal transmission. The first wiring bus 111 is connected to I/O pins of DQ 0~3 of the first DUT and the second wiring bus 112 is connected to I/O pins of DQ 4~7 of the first DUT.

The third wiring bus 113 and the fourth wiring bus 114 are connected to the second device area 122. The location of the second device area 122 is corresponding to another socket to physically carry and electrically connect a second DUT where the second DUT also has I/O pins of DQ 0~3 and DQ 4~7 which is the same as the first DUT. The third wiring bus 113 is connected to I/O pins of DQ 0~3 of the second DUT and the fourth wiring bus 114 is connected to I/O pins of DQ 4~7 of the second DUT.

The first I/O driver module bus 130 is connected to the first wiring bus 111 through a first driving bus 131. And the fourth wiring bus 114 is Y-shaped connected to the node 115 between the first driving bus 131 and the first wiring bus 111. During the testing processes of the present embodiment, the first I/O driver module bus 130 is connected to I/O pins of DQ 0~3 of the first DUT in the first device area 121 and also connected to I/O pins of DQ 4~7 of the second DUT in the second device area 122. The first I/O driver module bus 130 includes an input driver 134 and an output receiver 135 to drive the input/output of a testing pattern. Moreover, the first terminator bus 132 is connected to the first driving bus 131 through a first grounding bus 133 where the first terminator bus 132 has a voltage termination bus 132A which is connected between a resistor network 132B and a ground 132C in series connection. When operating in a reading mode, the first terminator bus 132 is connected to I/O pins of DQ 0~3 of the first DUT in the first device area 121 and also connected to I/O pins of DQ 4~7 of the second DUT in the second device area 122.

The second I/O driver module bus 140 is connected to the third wiring bus 113 through a second driving bus 141 and the second wiring bus 112 is Y-shaped connected to the node 116 between the second driving bus 141 and the third wiring bus 113. During the testing processes of the present embodiment, the second I/O driver module bus 140 is connected to I/O pins of DQ 4~7 of the first DUT in the first device area 121 and also connected to I/O pins of DQ 0~3 of the second DUT in the second device area 122. The structure of the second I/O driver module bus 140 can be the same as the one of the first I/O driver module bus 130. Furthermore, the second terminator bus 142 is connected to the second driving bus 141 through a second grounding bus 143 where the structure of the second terminator bus 142 can be the same as the one of the first terminator bus 132, comprising a voltage termination bus connected between a resistor network and a ground in series connection. When operating in a reading mode, the second terminator bus 142 is connected to I/O pins of DQ 4~7 of the first DUT in the first device area 121 and also connected to the I/O pins of DQ 0~3 of the second DUT in the second device area 122. In the present embodiment, the first terminator bus 132 is adjacent to the first I/O driver module bus 130 and the second terminator bus 142 is adjacent to the second I/O driver module bus 140 to effectively shorten the length of the first grounding bus 133 and the second grounding bus 143.

As shown in FIG. 1 again, the memory testing device can be implemented in x4 test mode of memory testing processes. During x4 writing mode, a testing pattern is provided from the first I/O driver module bus 130 and is sent to DQ 0~3 pins of the first DUT in the first device area 121 through the first driving bus 131 and the first wiring bus 111. Another testing pattern is provided from the second I/O driver module bus 140 and is sent to DQ 0~3 pins of the second DUT in the second device area 122 through the second driving bus 141 and the third wiring bus 113 so that testing patterns are written into a plurality of DUTs using x4 test mode where DQ 4~7 pins in the first device area 121 and in the second device area 122 are not connected with the I/O driver module buses 130 and 140 which are shadowed as shown in FIG. 1. In the same matter, in x4 reading mode, the written testing patterns can be sent back to the corresponding I/O driver module buses 130 and 140 from DQ 0~3 pins in the device areas 121 and 122. Therefore, the connection between the first driving bus 131 and the first wiring bus 111 and the connection between the second driving bus 141 and the third wiring bus 113 are shown by double arrows to illustrate two-way transmission.

Figure 2:
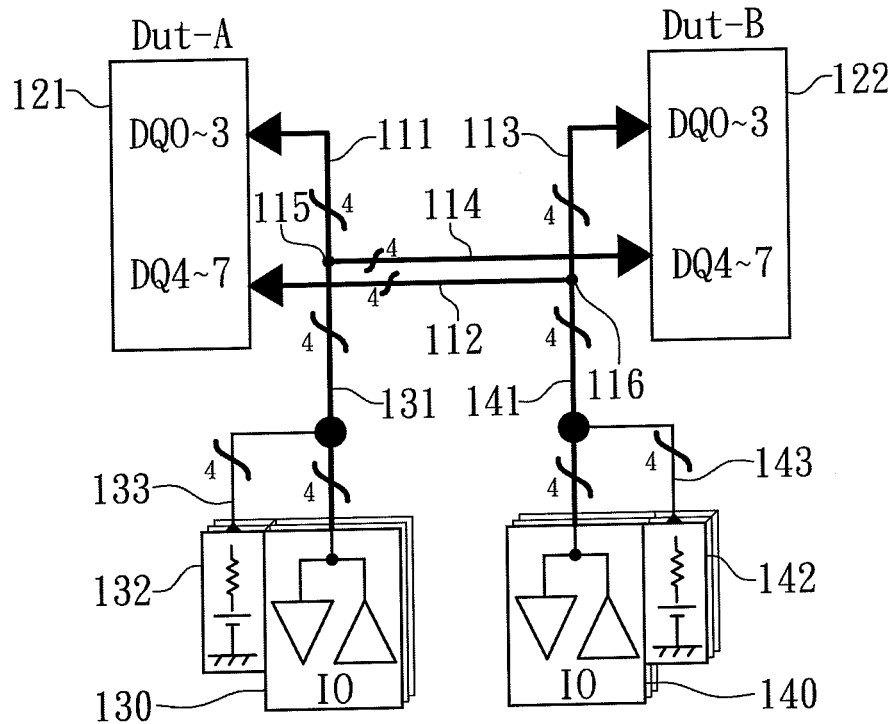
FIG. 2 is a circuitry illustration of the memory testing device when writing I/O pins with x8 test mode according to the preferred embodiment of the present invention.

As shown in FIG. 2, the memory testing device can be implemented in x8 I/O memory testing. Firstly, a first DUT is disposed in the first device area 121 and the second DUT is disposed in the second device area 122. During x8 writing mode, a first testing pattern is provided from the first I/O driver module bus 130 and sent to DQ 0~3 pins of the first DUT in the first device area 121 through the first driving bus 131 and the first wiring bus 111 and, at the same time, also sent to DQ 4~7 pins of the second DUT in the second device area 122 through the first driving bus 131 and the Y-shaped connected fourth wiring bus 114. Furthermore, a second testing pattern is offered from the second I/O driver module bus 140 and sent to DQ 0~3 pins of the second DUT in the second device area 122 through the second driving bus 141 and the third wiring bus 113 and, at the same time, also sent to DQ 4~7 pins of the first DUT in the first device area 121 through the second driving bus 141 and the Y-shaped connected second wiring bus 112 to achieve synchronized x8 cross writing into a plurality of DUTs. Therefore, the input terminals of the first wiring bus 111, the second wiring bus 112, the third wiring bus 113, and the fourth wiring bus 114 are shown by single-arrows to illustrate x8 writing paths. To be more specific, the testing patterns sent through the second wiring bus 112 and the fourth wiring bus 114 are not sent from the corresponding drivers but from the cross interconnected second I/O driver module bus 140 and the first I/O driver module bus 130.

Furthermore, preferably, the first wiring bus 111 and the fourth wiring bus 114 are of a same length to achieve the same timing skew so that the testing pattern sent from the first I/O driver module bus 130 can be simultaneously received by DQ 0~3 pins of the first DUT in the first device area 121 and by DQ 4~7 pins of the second DUT in the second device area 122 without time delay to achieve signal synchronization for the both device areas 121 and 122. Preferably, the second wiring bus 112 and the third wiring bus 113 are also of a same length so that the testing pattern sent from the second I/O driver module bus 140 can be simultaneously received by DQ 4~7 pins of the first DUT in the first device area 121 and by DQ 0~3 pins of the second DUT in the second device area 122 to avoid signal asynchronization.

Figure 3:
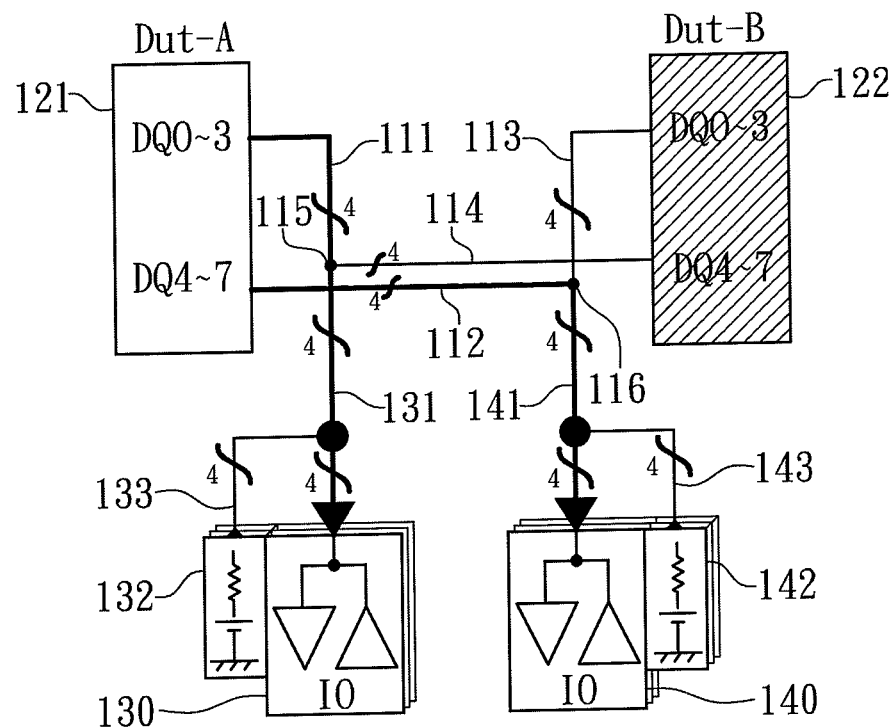
FIG. 3 is a circuitry illustration of the memory testing device when reading I/O pins of the first device area with x8 test mode (the first sectional operation of x8 test mode) according to the preferred embodiment of the present invention.

The memory testing device under x8 memory testing during a first sectional x8 reading mode is illustrated in FIG. 3. Firstly, enable signal in the second device area 122 is terminated and only the testing patterns stored in the first DUT in the first device area 121 can be sent out in a first sectional reading mode. The first testing pattern from the first device area 121 is sent to the first I/O driver module bus 130 through DQ 0~3 pins of the first DUT in the first device area 121, the first wiring bus 111, and the first driving bus 131. The second testing pattern from the first device area 121 is sent to the second I/O driver module bus 140 through DQ 4~7 pins in the first DUT of the first device area 121, the second wiring bus 112 and the second driving bus 141 to achieve x8 reading test of the first DUT.

Figure 4:
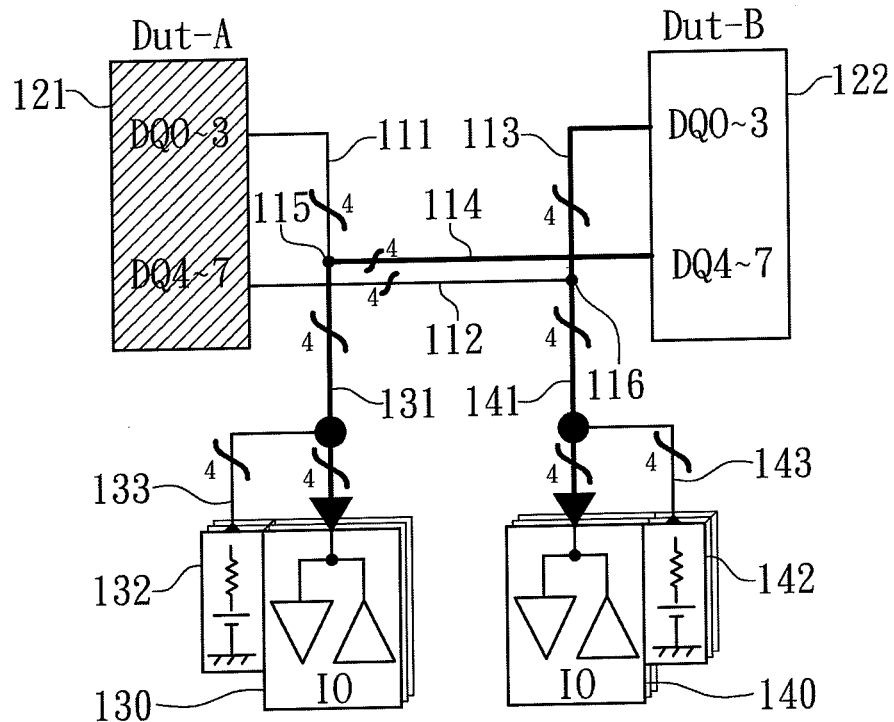
FIG. 4 is a circuitry illustration of the memory testing device when reading I/O pins of the second device area with x8 test mode (the second sectional operation of x8 test mode) according to the preferred embodiment of the present invention.

Then, as shown in FIG. 4, enable signal in the second device area 122 is initiated and enable signal in the first device area 121 is terminated. Only the testing patterns stored in the second DUT in the second device area 122 can be sent out in a second sectional reading mode. The second testing pattern in the second DUT in the second device area 122 is sent to the second I/O driver module bus 140 through DQ 0~3 pins of the second DUT in the second device area 122, the third wiring bus 113 and the second driving bus 141. The first testing pattern in the second DUT in the second device area 122 is sent to the first I/O driver module bus 130 through DQ 4~7 pins of the second DUT in the second device area 122, the fourth wiring bus 114 and the first driving bus 131 to achieve x8 reading test of the second DUT.

Therefore, the memory testing device with cross interconnection of multiple drivers of the present invention can universally be implemented in DUT testing for different I/O configuration such as x4 or x8 test modes without changing the testing fixtures. Moreover, testing patterns can be synchronously written into a plurality of DUTs and then read with different sections so that the DUTs do not need to be unloaded and numbers of parallel DUTs do not need to be reduced during testing processes.

Furthermore, the present invention is not limited to universal implementation of x4 and x8 test modes. When each wiring bus is increased from four to eight, then the test modes can be increased to x8 and x16 . . . etc same concept for universal implementation The above description of embodiments of this invention is intended to be illustrative but not limited. Other embodiments of this invention will be obvious to those skilled in the art in view of the above disclosure which still will be covered by and within the scope of the present invention even with any modifications, equivalent variations, and adaptations.

What is claimed is:

1. A memory testing device with cross interconnection of multiple drivers comprising:
   a first wiring bus and a second wiring bus connected to a first device area;
   a third wiring bus and a fourth wiring bus connected to a second device area;
   a first I/O driver module connected to the first wiring bus through a first driving bus, wherein the fourth wiring bus is Y-shaped connected to a node between the first driving bus and the first wiring bus;
   a first terminator bus connected to the first driving bus through a first grounding bus;
   a second I/O driver module connected to the third wiring bus through a second driving bus, wherein the second wiring bus is Y-shaped connected to a node between the second driving bus and the third wiring bus; and
   a second terminator bus connected to the second driving bus through a second grounding bus,
   wherein each of a first DUT for being mounted on the first device area and a second DUT for being mounted on the second device area has a plurality of first I/O pins and a plurality of second I/O pins,
   wherein the first I/O pins of the first DUT connected with the first wiring bus are different from the second I/O pins of the second DUT connected with the fourth wiring bus in pin definitions, wherein the first wiring bus and the fourth wiring bus are connected to the first I/O driver module, and
   wherein the second I/O pins of the first DUT connected with the second wiring bus are different from the first I/O pins of the second DUT connected with the third wiring bus in pin definitions, wherein the second wiring bus and the third wiring bus are connected to the second I/O driver module.

2. The memory testing device as claimed in claim 1, wherein the first terminator bus is adjacent to the first I/O driver module, and the second terminator bus is adjacent to the second I/O driver module.

3. The memory testing device as claimed in claim 1, wherein the first wiring bus and the fourth wiring bus are of a same length.

4. The memory testing device as claimed in claim 3, wherein the second wiring bus and the third wiring bus are of a same length.

5. A memory testing method comprising:
   providing a memory testing device comprising:
   a first wiring bus and a second wiring bus connected to a first device area;
   a third wiring bus and a fourth wiring bus connected to a second device area;
   a first I/O driver module connected to the first wiring bus through a first driving bus, wherein the fourth wiring bus is Y-shaped connected to a node between the first driving bus and the first wiring bus;
   a first terminator bus connected to the first driving bus through a first grounding bus;
   a second I/O driver module connected to the third wiring bus through a second driving bus, wherein the second wiring bus is Y-shaped connected to a node between the second driving bus and the third wiring bus; and
   a second terminator bus connected to the second driving bus through a second grounding bus;
   wherein each of a first DUT for being mounted on the first device area and a second DUT for being mounted on the second device area has a plurality of first I/O pins and a plurality of second I/O pins;
   wherein the first I/O pins of the first DUT connected with the first wiring bus are different from the second I/O pins of the second DUT connected with the fourth wiring bus in pin definitions, wherein the first wiring bus and the fourth wiring bus are connected to the first I/O driver module;
   wherein the second I/O pins of the first DUT connected with the second wiring bus are different from the first I/O pins of the second DUT connected with the third wiring bus in pin definitions, wherein the second wiring bus and the third wiring bus are connected to the second I/O driver module;
   in a writing mode, sending a first testing pattern from the first I/O driver module to the first device area through the first driving bus and the first wiring bus and also to the second device area through the first driving bus and the Y-shaped connected fourth wiring bus at the same time; meanwhile, sending a second testing pattern from the second I/O driver module to the second device area through the second wiring bus and the third wiring bus and also to the first device area through the second driving bus and the Y-shaped connected second wiring bus at the same time;
   in a first sectional reading mode, reading the result of the first testing pattern in the first device area to the first I/O driver module through the first wiring bus and the first driving bus; meanwhile, reading the result of the second testing pattern in the first device area to the second I/O driver module bus through the second wiring bus and the second driving bus; and
   in a second sectional reading mode, reading the result of the second testing pattern in the second device area to the second I/O driver module bus through the third wiring bus and the second driving bus; meanwhile, reading the result of the first testing pattern in the second device area to the first I/O driver module through the fourth wiring bus and the first driving bus.

6. The method as claimed in claim 5, wherein the first terminator bus is adjacent to the first I/O driver module bus, and the second terminator bus is adjacent to the second I/O driver module.

7. The method as claimed in claim 5, wherein the first wiring bus and the fourth wiring bus are of a same length.

8. The method as claimed in claim 7, wherein the second wiring bus and the third wiring bus are of a same length.

* * * * *